United States Patent [19]
Kautz et al.

[11] Patent Number: 5,922,509
[45] Date of Patent: Jul. 13, 1999

[54] PHOTOIMAGEABLE COMPOSITIONS HAVING IMPROVED STRIPPING PROPERTIES IN AQUEOUS ALKALINE SOLUTIONS

[75] Inventors: Randall W. Kautz, Irvine; Robert K. Barr, Laguna Niguel, both of Calif.

[73] Assignee: Morton International, Inc., Chicago, Ill.

[21] Appl. No.: 09/040,973

[22] Filed: Mar. 18, 1998

Related U.S. Application Data

[51] Int. Cl.$^6$ ............... G03C 1/725; C08J 3/28
[52] U.S. Cl. ............ 430/281.1; 430/910; 430/912; 430/916; 430/920; 522/114
[58] Field of Search ............... 430/281.1, 910, 430/912, 916, 920; 522/114; 526/79, 86, 87

[56] References Cited

U.S. PATENT DOCUMENTS

| | | | |
|---|---|---|---|
| 3,934,057 | 1/1976 | Moreau et al. | 427/43 |
| 4,123,272 | 10/1978 | Quinn | 96/35.1 |
| 4,239,849 | 12/1980 | Lipson et al. | 430/281 |
| 4,427,760 | 1/1984 | Nagazawa et al. | 430/287 |
| 4,472,494 | 9/1984 | Hallman et al. | 430/160 |
| 4,610,951 | 9/1986 | Lipson et al. | 430/313 |
| 4,629,680 | 12/1986 | Iwasaki et al. | 430/288 |
| 4,689,290 | 8/1987 | Worns | 430/286 |
| 4,925,768 | 5/1990 | Iwasaki et al. | 430/271 |
| 5,061,602 | 10/1991 | Koch et al. | 430/281 |
| B1 3,953,309 | 4/1976 | Gilano et al. | 204/159.16 |

OTHER PUBLICATIONS

Hanabata, M., et al., *Stone Wall Model for Positive Photoresist Development*, Osaka Research Laboratory, Japan, Mar., 1998, pp. 1–6.

Hanabata, M., et al., *Design Concept for a High–Performance Positive Photoresist*, J.Vac. Sci. Technol. B., vol. 7, No. 4, Jul./Aug. 1989, pp. 640–650.

*Primary Examiner*—Janet Baxter
*Assistant Examiner*—Rosemary Ashton
*Attorney, Agent, or Firm*—Steven C. Benjamin; Gerald K. White

[57] ABSTRACT

A negative-acting photoimageable composition useful as a photoresist comprises an acid-functional binder polymer, a photopolymerizable component, and a photoinitiator chemical system, in which the binder polymer has a multi-modal molecular weight distribution used to promote faster photoresist stripping times and a smaller stripped particle size. The combination of faster stripping times and smaller stripped particle size allows for fully aqueous, environmentally friendly, stripping of the photoresist from overplated circuit boards.

16 Claims, 2 Drawing Sheets

PHOTOIMAGEABLE COMPOSITIONS HAVING IMPROVED STRIPPING PROPERTIES IN AQUEOUS ALKALINE SOLUTIONS

FIELD OF THE INVENTION

This invention relates to negative-acting photoimageable compositions such as those used as photoresists used to form printed circuit boards. The photoimageable compositions contain a binder polymer with a multi-modal molecular weight distribution used to improve stripping in environmentally favorable fully aqueous alkaline stripping solutions.

BACKGROUND OF THE INVENTION

This invention is directed to negative-acting photoimageable compositions which are developable in alkaline aqueous solutions. Such photoimageable compositions are useful for various purposes in the manufacture of printed circuit boards. This invention is particularly applicable to primary imaging photoresists which are used in the creation of the printed circuitry itself.

A variety of such negative-acting photoimageable compositions have been described. The essential ingredients include A) a film-forming binder polymer; B) photopolymerizable α,β-ethylenically unsaturated compound(s), and C) a photoinitiator chemical system. The binder polymer A) usually has sufficient acid functionality, generally carboxylic acid functionality, so that it is soluble (until exposed to actinic radiation) in dilute alkaline aqueous solutions and thus renders the photoimageable composition developable in the same. The binder polymer A) in the polymerized state (after exposure to actinic radiation) is resistant to the developing, etching and plating solutions, but retains sufficient acid functionality which renders the photoimageable composition releasable or strippable in strong alkaline aqueous solutions. Furthermore, the standard binder polymer A) usually comprises a single monodisperse polymer identifiable by a single narrow peak on a molecular weight distribution graph.

One problem with the use of such photoimageable compositions as photoresists is that they are difficult to strip from electrolytically plated circuit boards using conventional alkaline aqueous stripping solutions, e.g., 3% NaOH solution. This problem arises from the recent demand on circuit board manufacturers to reduce the size of printed circuit boards, while also increasing their functional capabilities. Consequently, the circuit lines and spaces on the circuit boards have continued to shrink, as more circuitry needs to be fit onto smaller surfaces. At the same time, metal plating heights have also increased above the thickness of the photoresist. This causes the metal to hang over the photoresist, resulting in a very narrow space containing the photoresist being virtually encapsulated by the overplating. The photoresist then becomes trapped by the plated overhang, making it difficult to attack and strip by conventional methods. If the resist is not stripped clean, ragged copper circuit lines will result after etching which are unusable, since they can cause short circuiting of the board.

Some circuit board manufacturers have tried thicker photoresists to accommodate the increasing plating heights. But this approach is more expensive and limits resolution of the circuit lines. The majority use organic-based (amine- or organic solvent-containing) alkaline stripping solutions, which produce a smaller stripped particle to facilitate stripping. While these organic strippers, e.g., solutions containing trimethylamine or tetramethylammonium hydroxide, remove the resist better, they are expensive (relative to NaOH or KOH) and have more waste treatment and environmental concerns associated with them. Moreover, due to the recent emphasis on reducing solvent emissions in the workplace, solvent-strippable photoresists are much less desirable than those that are aqueous-strippable.

It, therefore, would be desirable to provide photoimageable compositions useful as photoresists which do not suffer from the foregoing disadvantages.

This invention provides photoimageable compositions useful as photoresists that exhibit improved stripping properties, and that can be quickly stripped from overplated circuit traces in environmentally favorable, physiologically safe, fully aqueous, alkaline stripping solutions, without compromising the quality of the patterned circuit lines.

SUMMARY OF THE INVENTION

It is an object of this invention, therefore, to provide a negative-acting photoimageable composition which does not suffer from the foregoing drawbacks.

It is another object of this invention to provide a negative-acting photoimageable composition useful as a primary imaging photoresist in the manufacture of printed circuit boards that can be quickly and cleanly stripped from overplated circuit traces in environmentally friendly, physiologically safe, fully aqueous, alkaline stripping solutions, without compromising the quality of the printed circuitry left behind.

Broadly stated, this invention resides in a negative-acting photoimageable composition useful as a photoresist that includes a modification to the binder polymer system to improve stripping of the photoresist in fully aqueous alkaline stripping solutions. By producing a single binder polymer with a multi-modal molecular weight distribution that mimics a physical blend of two or more binder polymers, the stripped particle size and the time for complete stripping can both be reduced. The combination of faster stripping times and smaller stripped particle size, in turn, allows for fully aqueous, high resolution, stripping of the photoresist, even from overplated circuit boards.

The various objects, features and advantages of this invention will become more apparent from the following description and appended claims.

BRIEF DESCRIPTION OF THE DRAWINGS

With this description of the invention, a detailed description follows with reference made to the accompanying drawing in which.

DETAILED DESCRIPTION OF THE PREFERRED EMBODIMENTS

Figure 1:
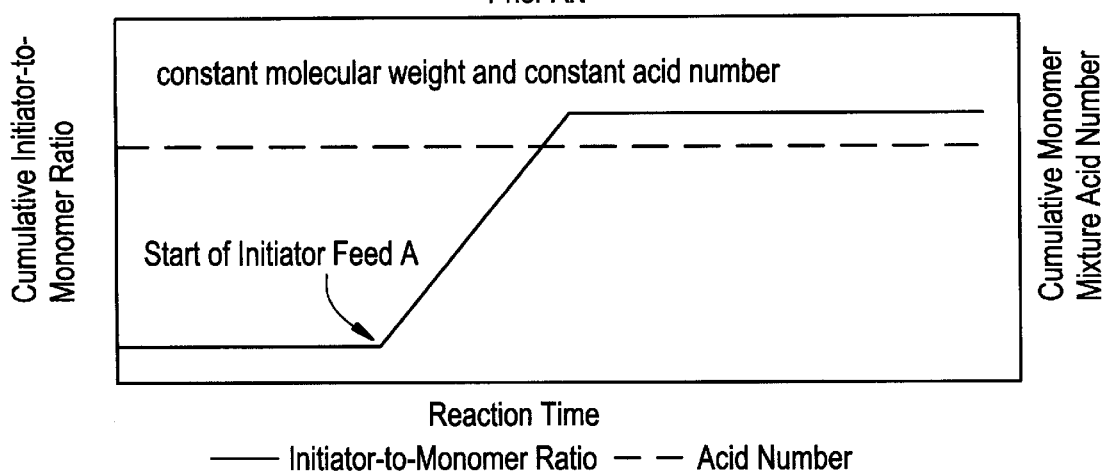
FIG. 1 is a process chart for the preparation of a standard (prior art) monodisperse binder polymer system.

Throughout this specification, all parts and percentages specified herein are by weight unless otherwise stated.

Component A) (the binder polymer), Component B) (the photoimageable compound(s)) and Component C) (the photoinitiator chemical system) are herein considered to equal 100 wt. %, and other components are calculated as parts relative to 100 parts of A) plus B) plus C).

In accordance with this invention, the binder polymer component A) comprises a single polymer with a multi-modal molecular weight distribution that mimics the properties of a physical mixture of two or more, separately prepared, binder polymers of differing (high and low) molecular weights and acid numbers, without the need for making such mixtures. The term "multi-modal" used herein refers to a molecular weight distribution where there is evidence of more than one peak. It will be appreciated by those of ordinary skill in the art that such evidence may appear as shoulders, rather than distinct peaks, on a molecular weight distribution graph, due to overlap in molecular weight ranges. The use of this type of binder polymer A) dramatically improves stripping in fully aqueous alkaline solutions.

The choice of the high and low average molecular weight components making up the multi-modal binder polymer A) may vary widely depending upon the particular photoimageable composition being employed and the final stripping properties required. This can be determined by those skilled in the art based on the teachings and examples provided. Generally, it is desirable to vary the high and low molecular weight polymer components in such proportions to provide the binder polymer A) with an overall weight average molecular weight (Mw) of between about 20,000 and 200,000, preferably at least about 70,000. The average molecular weight (Mw) generally found to be useful for the lower molecular weight polymer components ranges from about to 20,000 to 70,000, and preferably from about 30,000 to about 45,000. For the higher molecular weight polymer components, the useful range is generally from about 70,000 to 200,000, and preferably from about 100,000 to 150,000.

Since this invention is directed to photoimageable compositions which are developable in alkaline aqueous solution, the binder polymer A) will typically have substantial acid functionality, typically having an overall average acid number of at least about 100 mg KOH/g of polymer, preferably at least about 130 up to about 235. The acid functionality is usually carboxylic acid functionality, but may also include, for example, sulfonic or phosphoric acid functionality. Generally, it is desirable to provide the lower molecular weight polymer components with lower acid numbers, typically in the range from about 100 to 130, and preferably about 100. The higher molecular weight polymer components are produced with higher acid numbers, typically in the range from about 130 to 235, and preferably about 160.

The binder polymer A) is typically derived from a mixture of acid functional monomers and non-acid functional monomers. Some specific examples of suitable acid functional monomers are acrylic acid, methacrylic acid, maleic acid, fumaric acid, citraconic acid, 2-acrylamido-2-methylpropane sulfonic acid, 2-hydroxyethyl acrylolyl phosphate, 2-hydroxypropyl acrylol phosphate, 2-hydroxy-alpha-acryloyl phosphate, etc. One or more of such acid functional monomers may be used to form the binder polymer.

The acid functional monomers may be copolymerized with non-acid functional monomers, such as esters of acrylic acids, for example, methyl acrylate, methyl methacrylate, hydroxy ethyl acrylate, butyl methacrylate, octyl acrylate, 2-ethoxy ethyl methacrylate, t-butyl acrylate, n-butyl acrylate, 2-ethyl hexyl acrylate, n-hexyl acrylate, 1,5-pentanediol diacrylate, N,N-diethylaminoethyl acrylate, ethylene glycol diacrylate, 1,3-propanediol diacrylate, decamethylene glycol diacrylate, decamethylene glycol dimethacrylate, 1,4-cyclohexanediol diacrylate, 2,2-dimethylol propane diacrylate, glycerol diacrylate, tripropylene glycol diacrylate, glycerol triacrylate, 2,2-di(p-hydroxyphenyl)-propane dimethacrylate, triethylene glycol diacrylate, polyoxyethyl-2-2-di(p-hydroxyphenyl)-propane dimethacrylate, triethylene glycol dimethacrylate, polyoxypropyltrimethylol propane triacrylate, ethylene glycol dimethacrylate, butylene glycol dimethacrylate, 1,3-propanediol dimethacrylate, butylene glycol dimethacrylate, 1,3-propanediol dimethacrylate, 1,2,4-butanetriol trimethacrylate, 2,2,4-trimethyl-1,3-pentanediol dimethacrylate, pentaerythritol trimethacrylate, 1-phenyl ethylene-1,2-dimethacrylate, pentaerythritol tetramethacrylate, trimethylol propane trimethacrylate, 1,5-pentanediol dimethacrylate, and 1,4-benzenediol dimethacrylate; styrene and substituted styrene, such as 2-methyl styrene and vinyl toluene and vinyl esters, such as vinyl acrylate and vinyl methacrylate to provide the desired acid number.

In conventional photoimageable systems that employ standard monodisperse binder polymers, each binder polymer is prepared separately by well known techniques. For example, the desired acid and non-acid functional monomers chosen from the list above are dissolved in an appropriate solvent and heated in a reaction vessel in the presence of thermal free radical initiator to initiate polymerization. Examples of typical initiators include peroxide compounds, such as dibenzoyl peroxide, and azo compounds, such as 2,2' azobis(2-methylpropanenitrile), 2,2'-azobis(2-methylbutanenitrile), 2,2'-azobis(2,4-dimethylpentanenitrile), and 1,1'-azobis (cyclohexanecarbonitrile). The initiator-to-monomer ratio and monomer acid number is held constant during polymerization to produce a monodisperse polymer of a given molecular weight and acid number. Examples of standard monodisperse binder polymers and photoimageable compositions based on the same are found in U.S. Pat. Nos. 3,953,309; 4,003,877; 4,610,951; and, 4,695,527, the teachings of each of which are incorporated herein by reference.

In the present invention wherein the binder polymer A) is based on a single polymer having a multi-modal molecular weight distribution, the binder polymer A) is prepared by a novel technique not previously practiced in the art, but one which is well suited for making polymers of varying molecular weight components (or having increased polydispersity at a given molecular weight) and acid numbers in a single polymerization reaction. The technique involves varying the initiator-to-monomer ratio and the monomer mixture acid number during the polymerization reaction. Low initiator-to-monomer ratios along with high acid number monomer mixtures give polymers with high molecular weights and high acid numbers, and high initiator-to-monomer ratios along with low acid number monomer mixtures give polymers with low molecular weights and low acid numbers.

By varying the initiator-to-monomer ratio and the monomer mixture acid number during the reaction, significantly different overall polymer properties can be achieved in a single reaction. This eliminates the need to make and package different binder polymers separately, which, is advantageous from a production time, cost, and material handling standpoint.

Two reaction schemes have been identified for the preparation of the multi-modal binder polymer A). In a continuous reaction scheme, an overall initiator-to-monomer ratio and monomer mixture acid number is chosen to define the overall average molecular weight and acid number of the binder polymer A). Then the polymerization reaction can be carried out in a continuous reaction wherein the initiator-to-monomer ratio is started at a sufficiently low level and at the same time the monomer mixture acid number is sufficiently high to produce the desired high molecular weight and high acid number polymer components, and as the reaction proceeds, the initiator-to-monomer ratio is continually increased in a non-linear fashion to a sufficiently high level, while at the same time lowering the monomer mixture acid number to produce the desired low molecular weight and low acid number polymer components.

Alternatively, a sequential reaction scheme can be used wherein a first polymerization reaction is immediately followed by a second polymerization reaction in a single reaction vessel. In the sequential reaction, the initiator-to-monomer ratio and the monomer mixture acid number is adjusted to a first constant level to produce polymer components having a given molecular weight and acid number, followed by adjusting the initiator-to-monomer ratio and the monomer mixture acid number to a second constant level to produce polymer components having a different given molecular weight and acid number, wherein the overall average molecular weight and acid number fall within the desired range.

In both of the above reaction methods, it is believed that the lower molecular weight components should be carefully controlled below an acid number of about 230 to achieve the necessary developing latitude. Generally above this acid number, the presence of high acid, low molecular weight components in the photoimageable compositions undesirably create sites for developer attack and sidewall degeneration, which, in turn, produces ragged and unacceptable circuit lines during plating.

The amount of the multi-modal binder polymer A) employed may vary over a wide range, typically comprising between about 30 to about 80 wt % of the composition based on total weight of A) plus B) plus C).

The photopolymerizable component B) is typically a monomer, dimer or short chain oligomer having ethylenic unsaturation, particularly, $\alpha,\beta$-ethylenic unsaturation, including monofunctional compounds and compounds having $\alpha,\beta$-ethylenic unsaturation functionality of 2 or greater. Typically, a mixture of mono-functional and multi-functional monomers will be used. Suitable photopolymerizable compounds include, but are not limited to, the monomers recited above as suitable for forming binder polymers, particularly the non-acid functional compounds.

The amount of photopolymerizable component B) is typically between about 19 and about 69 wt % of the photoimageable composition based on total weight of A) plus B) plus C).

To initiate free-radical addition polymerization and crosslinking of the binder polymer A) with the photopolymerizable monomer B) upon exposure to actinic radiation, the photoimageable composition contains a free-radical generating photoinitiator chemical system. Suitable photoinitiators C) include, for example, 9-phenyl acridine, benzoin ethers, benzil ketals, acetophenones, benzophenones and related compounds with amines. Also, suitable 9-phenyl acridine homologues, such as those described in U.S. Pat. No. 5,217,845, the teaching of which is incorporated herein by reference, are useful photoinitiators.

Between about 0.05 wt % and about 2 wt %, preferably between about 0.1 and about 0.5 wt % of the photoimageable composition based on total weight of A) plus B) plus C) is the photoinitiator component C).

Flexibility is improved through the inclusion of plasticizers D) in the photoimageable compositions. Suitable plasticizers D) include dibenzoate plasticizers, such as dipropyleneglycol dibenzoate, diethylene glycol dibenzoate, polypropyleneglycol dibenzoate, and polyethylene glycol dibenzoate.

The plasticizer D) is used at levels of between about 1 and about 8 wt % relative to total weight of A) plus B) plus C), typically at between about 2 and about 6 wt %.

Additionally, the photoimageable compositions may contain a wide variety of additional components as are known in the art, including additional polymers, such as those which might be used to effect a final hardened cure of a solder mask, dyes, stabilizers, flexibilizing agents, fillers, etc.

The photoimageable compositions of this invention may be applied to an abraded or chemically cleaned copper-clad board in liquid form and then allowed to dry. Alternatively, the photoimageable compositions may be used in the form of a dry film comprising a layer of photoimageable composition on a flexible support sheet. The dry film is subsequently laminated onto to the circuit board panel with the layer of photoimageable material facing the panel. In forming a dry film, a solvent-borne photoimageable composition is applied to the flexible support sheet, e.g., polyethylene terephthalate, and then dried to remove the solvent and volatiles. The support material is somewhat flexible but has sufficient rigidity to provide structure to the layer of photoimageable material. It is typical to also provide a protective sheet, e.g., polyethylene, on the surface of the photoimageable layer opposite the cover sheet, and roll the dry film into reels. The protective sheet, in addition to protecting the photoimageable layer, better enables the dry film to be rolled into a reel. The protective sheet is removed from the photoresist layer prior to application to the circuit board.

Processing of the photoimageable composition is in a conventional manner. In a typical plating procedure, a panel for forming a printed circuit board comprises a thin layer of metal, e.g., copper, covering a non-conductive substrate, e.g., glass reinforced epoxy. A layer of the negative-acting photoimageable composition, either formed from a liquid composition or transferred as a layer from a dry film, is applied to the metal surface of the metal-clad board. The photoresist is then exposed to patterned actinic radiation, e.g., by passing illumination through artwork having an opaque/transparent pattern. The exposed photoresist is next developed by exposure to a dilute alkaline aqueous solution, e.g., 1% sodium carbonate solution, which washes away the unexposed portion of the photoresist and leaves behind a patterned layer of exposed, i.e., polymerized, photoresist. The panel is then pattern plated, whereby the areas devoid of photoresist are electrolytically plated with a second metal layer, e.g., copper. A protective layer, e.g., tin or tin/lead, is then plated onto the second metal layer to prevent removal of the plated copper circuit lines during final processing. Subsequent to plating, the remaining photoresist is stripped away in a highly alkaline aqueous solution, e.g., 3% sodium hydroxide solution, and the newly exposed areas of metal are then selectively removed in an etching solution, e.g., of ammonium hydroxide, leaving behind the pattern plated areas. Lastly, the protective top layer, e.g., tin or tin/lead, is stripped in an acid solution, e.g., hydrochloric acid, leaving behind the patterned copper circuit lines.

In summary, this invention provides a method to improve the stripping properties of a photoresist even from overplated circuit boards in fully aqueous alkaline stripping solutions, e.g., NaOH or KOH. The most surprising aspect of this invention is that inclusion of a multi-modal binder polymer A) of the aforesaid character in the photoresist produces faster photoresist stripping times, while stripping in a smaller particle size. With conventional photoresists based on standard monodisperse binder polymers, a faster stripping time usually leads to a larger stripped particle size that prevents the stripper from attacking the resist in tight spaces, such as those created by overplated circuit lines, and leaves behind parts of the resist after stripping. While not wishing to be bound by any particular theory, it is believed that the solid matrix of low molecular weight, low acid number components of the multi-modal binder polymer A) dissolve faster and thus are displaced first, leaving behind the remaining matrix of high molecular weight, high acid number components. Once the smaller components have been removed, the surface area of the high molecular weight components which are in contact with the alkaline aqueous stripping solution increases, which leaves the larger components more vulnerable to stripper attack. Therefore, the multi-modal polymer matrix strips significantly faster and in an appreciably smaller particle size than a standard monodisperse binder polymer system, even though the average molecular weight and acid number for both systems are equivalent. Another benefit of this invention is that it allows for use of alkaline aqueous stripping solutions with lower alkali concentrations, e.g., 1% NaOH, which reduces the stripped particle size even further without impractically increasing the stripping time.

This invention will be now be described in greater detail by way of the following non-limiting examples.

EXAMPLE 1

Preparation of a Standard (Monodisperse) Binder Polymer

For comparative purposes, a standard (prior art) monodisperse binder polymer was prepared by reacting the following ingredients in the given proportions using the below described reaction method.

| Process Steps | Duration (hours) | Solvent[1] | Ingredients (grams) Monomer | Initiator[2] |
|---|---|---|---|---|
| 1. Initial Conditions | 0.25 | 786.3 | $MAA^3$ 84.0<br>$MMA^4$ 271.1<br>$nBA^5$ 64.3<br>Total 420.0 | 2.42 |
| 2. Monomer/Initiator Feed (Linear) | 3.25 | 257.6 | MAA 126.0<br>MMA 407.6<br>nBA 96.4<br>Total 630.0 | 3.63 |
| 3. Initiator Feed A | 2.5 | 233.5 | — | 30.28 |
| 4. Final Conditions | 5.0 | 512.8 | — | — |
| Process Totals | 11.0 hrs | 1790.2 gm | 1050.0 gm | 44.33 gm |

Table Footnotes
Note 1 - Solvent = 2:1 Methyl Ethyl Ketone:Isopropyl Alcohol
Note 2 - Initiator = 2,2'-Azobis(2-methylbutanenitrile)
Note 3 - MAA = Methacrylic Acid
Note 4 - MMA = Methyl Methacrylate
Note 5 - nBA = nButyl Acrylate In Step 1, the solvent and three monomers (acid number=130) are placed into a reactor equipped with mechanical agitator and reflux condenser. The stirred mixture is heated at reflux (80–85° C.) and then the initiator is added to start the polymerization. The reaction mixture is then kept at reflux for 0.25 hours. In Step 2, a solution containing solvent, three monomers (acid number=130), and initiator are added at a constant rate to the reaction mixture over a 3.25 hour period, while maintaining reflux. In Step 3, a solution containing solvent and initiator is added at a constant rate to the reaction mixture over a 2.5 hour period, while maintaining reflux. This is to force any remaining monomers to convert to polymer. In Step 4, the reactor is sealed and the reaction mixture is heated to 94 C. for 5 hours to complete the conversion. The reaction mixture is then cooled and packaged.

Referring now to FIG. 1, it can be seen that the monomer mixture acid number and initiator-to-monomer ratio for the above standard monodisperse process are held constant prior to the start of Initiator Feed A (Step 3). Accordingly, the binder polymer formed during the process has a constant molecular weight and acid number.

EXAMPLE 2

Preparation Of a Continuous Multi-Modal (Polydisperse) Binder Polymer

A multi-modal (polydisperse) binder polymer was prepared by reacting the following ingredients in the given proportions using the below described continuous reaction method.

| Process Steps | Duration (hours) | Solvent[1] | Ingredients (grams) Monomer | Initiator[2] |
|---|---|---|---|---|
| 1. Initial Conditions | 2.0 | 880.5 | $MAA^3$ 128.6<br>$MMA^4$ 316.1<br>$nBA^5$ 80.3<br>Total 525.0 | 1.01 |
| 2. Monomer/Initiator Feed (Non-Linear) | 3.0 | 367.1 | MAA 81.4<br>MMA 363.3<br>nBA 80.3<br>Total 525.0 | 9.07 |
| 3. Initiator Feed A | 1.5 | 257.9 | — | 30.22 |
| 4. Initiator Feed B | 1.0 | 86.4 | — | 10.07 |
| 5. Final Conditions | 4.0 | 192.3 | — | — |
| Process Totals | 11.5 hrs | 1784.2 gm | 1050.0 gm | 50.37 gm |

In Step 1, the solvent and three monomers (acid number=160) are placed into a reactor equipped with mechanical agitator and reflux condenser. The stirred mixture is heated at reflux (80–85° C.) and then the initiator is added to start polymerization. The reaction mixture is then kept at reflux for 2.0 hours. In Step 2, a solution of initiator and solvent is added to the reaction mixture at a non-linear increasing rate over a 3 hour period. Simultaneous and separately, a mixture of three monomers (acid number=100) is added to the reaction mixture at a non-linear decreasing rate over a 3 hour period. The table below shows the cumulative weight of each solution delivered to the reactor during the non-linear feed. In Step 3, a first solution containing the solvent and initiator is added at a constant rate to the reaction mixture over a 1.5 hour period, while maintaining reflux. In Step 4, a second solution containing solvent and initiator is added at a constant rate to the reaction mixture over a 1 hour period, while maintaining reflux. In Step 5, the reactor is sealed and the reaction mixture is heated to 94° C. for 4 hours. The reaction mixture is then cooled and packaged.

| Elapsed Time (hours) | Monomer Mixture (grams) | Initiator Mixture (grams) |
|---|---|---|
| 0 | 0 | 0 |
| 0.1 | 96 | 0.4 |
| 0.5 | 214 | 10 |
| 1 | 303 | 42 |
| 1.5 | 371 | 94 |
| 2 | 429 | 167 |
| 2.5 | 479 | 261 |
| 3 | 525 | 376 |

Figure 2:
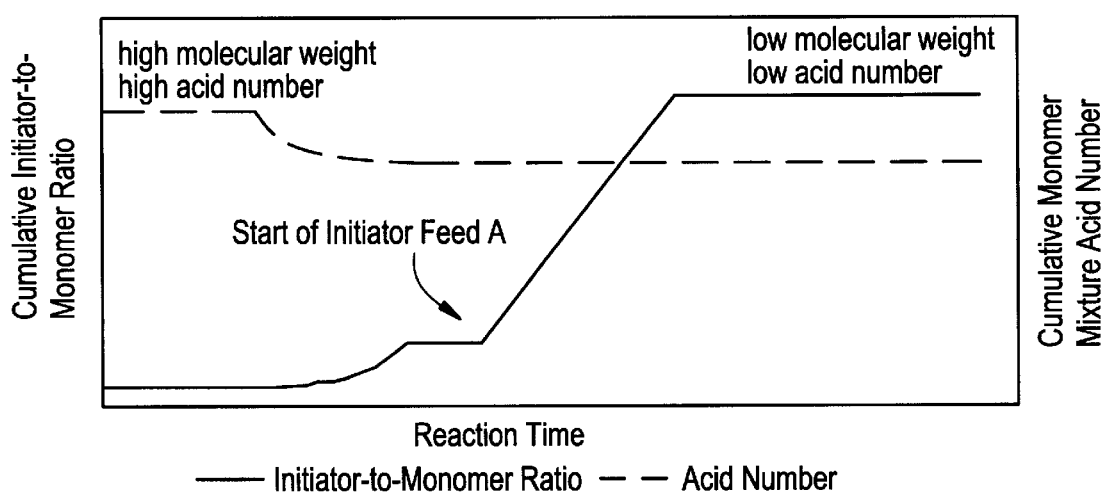
FIG. 2 is a process chart for the preparation of a multi-modal binder polymer according to the present invention.

Referring now to FIG. 2, a graph is provided showing the concept of varying the initiator loading and the monomer mixture acid number during the above process. Due to the variation of initiator loading and monomer mixture acid number, it can be seen that this process produces the high molecular weight and high acid number polymer components early in the process and the low molecular weight and low acid number polymer components later in the process.

EXAMPLE 3

Preparation Of a Sequential Multi-Modal (Polydisperse) Binder Polymer

A multi-modal (polydisperse) binder polymer was prepared by reacting the following ingredients in the given proportions using the below described sequential reaction method.

| Sub-Process | Process Steps | Duration (hours) | Solvent | Monomer | Initiator |
|---|---|---|---|---|---|
| A | 1. Initial Conditions | 1.0 | 787.0 | MAA 128.6<br>MMA 316.1<br>nBA 80.3<br>Total 525.0 | 0.51 |
|  | 2. Initiator Feed A | 6.0 | 49.6 | — | 1.52 |
|  | 3. Final Conditions | 2.0 | — | — | — |
| B | 1. Initial Conditions | 1.0 | 558.8 | MAA 81.4<br>MMA 363.3<br>nBA 80.3<br>Total 525.0 | 10.0 |
|  | 2. Initiator Feed B | 3.0 | 232.4 | — | — |
|  | 3. Final Conditions | 5.0 | 132.7 | — | — |
|  | Process Totals | 18.0 hrs | 1760.5 gm | 1050.0 gm | 32.03 gm |

Figure 3:
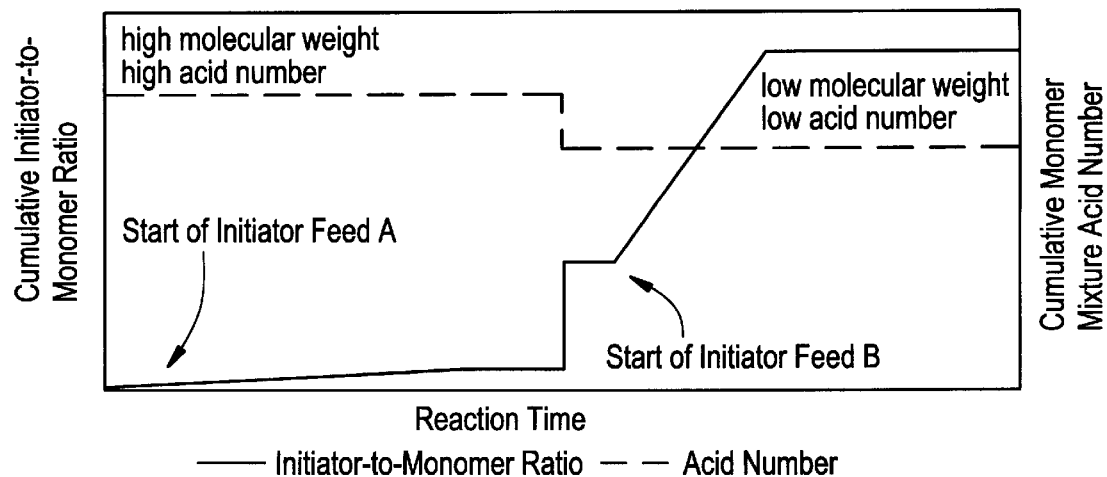
FIG. 3 is a process chart for the preparation of another multi-modal binder polymer according to the present invention; and, FIG. 4 is a molecular weight distribution graph for each of the different polymers produced by the processes of FIGS. 1–3 overlaid upon each other.

In Step A1, the solvent and three monomers (acid number=160) are placed into a reactor equipped with mechanical agitator and reflux condenser. The stirred mixture is heated at reflux (80–85° C.) and then the initiator is added to start the polymerization. The reaction mixture is then kept at reflux for 1 hour. In Step A2, a solution containing solvent and initiator is added at a constant rate to the reaction mixture over a 6 hour period, while maintaining reflux. In step A3, the reaction mixture is heated at reflux for an additional 2 hours. As can be seen in FIG. 3, Subprocess A is designed to produce the high molecular weight and high acid number binder polymer components.

In Step B1, solvent and three monomers (acid number=100) are placed into the same reactor which contains the reaction mixture from Step A3. The stirred mixture is heated as reflux (80–85° C.) and then the initiator is added to start the polymerization. The reaction mixture is then kept at reflux for 1 hour. In Step B2, a solution containing solvent and initiator is added at a constant rate to the reaction mixture over a 3 hour period, while maintaining reflux. In Step B3, the reactor is sealed and the reaction mixture is heated at 94° C. for 5 hours. The reaction mixture is then cooled and packaged. As can be seen in FIG. 3, Subprocess B is designed to sequentially produce the low molecular weight and low acid number binder polymer components.

Figure 4:
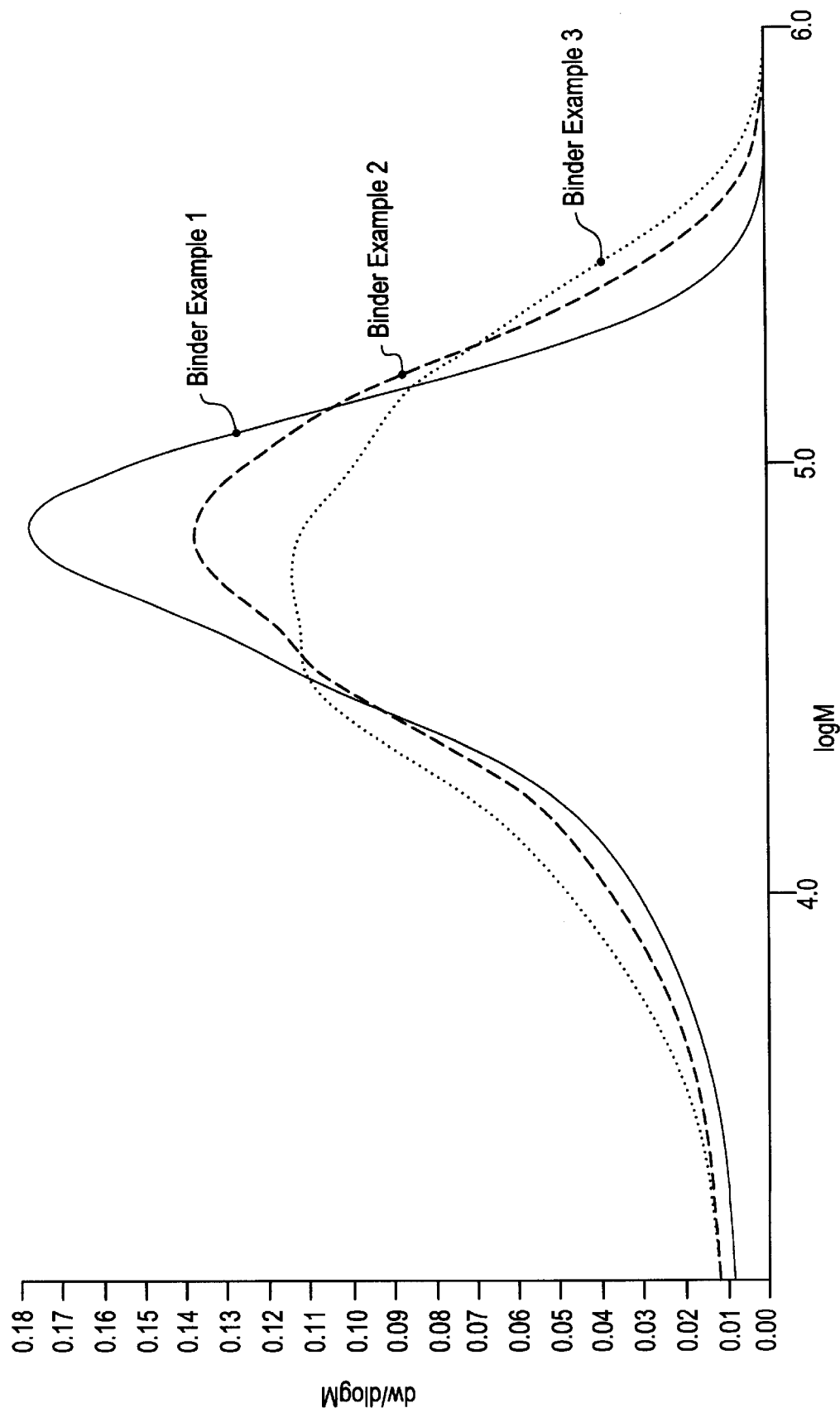

Referring now to FIG. 4, a molecular weight distribution graph is provided showing the molecular weight distribution for each of the above prepared binder polymers (Examples 1, 2 and 3) overlaid upon each other. The final properties of the binder polymers are given in the Table below.

| Binder Polymer | Acid Number | Average Molecular Weight (Mw) | Poly-Dispersity (Mw/Mn) |
|---|---|---|---|
| Example 1 | 130 | 69,000 | 3.0 |
| Example 2 | 130 | 77,000 | 4.0 |
| Example 3 | 130 | 79,000 | 4.5 |

EXAMPLE 4

Preparation of Negative-Acting Photoresists

The following ingredients were blended together in the given proportions to provide two negative-acting photoresist compositions, one based on the standard monodisperse binder polymer of Example 1, and the other based on the multi-modal binder polymer of Example 2.

| Ingredients | Formula "A" Standard | Formula "B" Multi-modal |
|---|---|---|
| Acrylic Polymer (23% methacrylic acid, 61% methylmethacrylate, 15% butyl acrylate) (Example 1) | 40.0 grams | — |
| Acrylic Polymer (23% methacrylic acid, 61% methylmethacrylate, 15% butyl acrylate) with Multi-modal Distribution | — | 40.0 grams |

-continued

| Ingredients | Formula "A" Standard | | Formula "B" Multi-modal | |
|---|---|---|---|---|
| (Example 2) | | | | |
| Tetraethyleneglycol diacrylate | 10.0 | grams | 10.0 | grams |
| Ethoxylated (3 moles) Trimethylolpropane Triacrylate | 20.0 | grams | 20.0 | grams |
| 9-phenyacridine | 0.2 | grams | 0.2 | grams |
| Dipropylene glycol dibenzoate | 2.0 | grams | 2.0 | grams |
| Michler's Ethyl Ketone | 0.09 | grams | 0.09 | grams |
| Nitrated Azo Dye (Furon Navy) | .075 | grams | .075 | grams |
| Methyl Hydroquinone | .045 | grams | .045 | grams |
| Triphenyl methane Dye (Flexoblue 680) | .025 | grams | .025 | grams |

All mixtures (Formulas "A" and "B") were prepared in 1:1 methyl ethyl ketone at approximately 50% solids. The solutions were coated onto biaxially oriented 92 gauge polyester support film and dried to approximately 1% or less retained solvent. A protective polyethylene film was applied over the coated mixtures. Next the polyethylene was removed, and the coated mixtures were laminated onto mechanically scrubbed 1 oz./FR-4/1 oz. clad copper composite using a hot roll laminator at 110° C. at 2 meters/minute and 3 bar pressure.

The laminated material was then imaged on a UV printer through an appropriate phototool with an adjusted exposure to obtain a copper step of 7 as measured with a Stouffer® 21 step wedge (approximately 20 mJ/cm$^2$). The exposed panels were then developed in a 1% sodium carbonate monohydrate solution at 30° C. using a conveyorized spray developer at about 26 psi with residence time adjusted so that the break point occurred at 50% of the chamber length, followed by several spray rinses using tap water and the deionized water.

Electroplating was accomplished in a plating tank using an appropriate copper sulfate plating solution at 15 amps/ft$^2$ for about 60 minutes. The plated boards were then stripped of the imaged and developed photoresist in a 3% sodium hydroxide solution at 54 C. in a conveyorized stripping unit equipped with multiple spray nozzles followed by a spray rinse of tap water.

Comparative photoresist performance results are given in the Table below.

| | Binder Polymer Properties | | | Photoresist Properties | | |
|---|---|---|---|---|---|---|
| | Average | | | | | |
| Formula | Acid Number | Molecular Weight (Mw) | Poly-Dispersity (Mw/Mn) | Break Point Time[1] | Stripping Time[2] | Stripping Mode[1] |
| Formula "A" | 130 | 69,000 | 3.0 | 17 seconds | 45 seconds | 10 mm |
| Formula "B" | 130 | 77,000 | 4.0 | 17 seconds | 38 seconds | 5 mm |

Table Footnotes
Note 1 - The breakpoint time was recorded at the point the resist dissolved completely in 1% Na$_2$CO$_3$ at 30° C.
Note 2 - The stripping time was recorded at the point the resist stripped completely in 3% NaOH at 54° C.
Note 3 - The particle size of the stripped resist pieces coming off the board were then measured with a standard gauge.

These results demonstrate that even though the average molecular weight and acid number for both systems are practically equivalent, the multi-modal binder polymer system strips faster and in a smaller particle size than the standard binder polymer system.

From the foregoing it will be seen that this invention is one well adapted to attain all ends and objects hereinabove set forth together with the other advantages which are apparent and inherent. Since many possible variations may be made of the invention without departing from the scope thereof, the invention is not intended to be limited to the embodiments and examples disclosed, which are considered to be purely exemplary. Accordingly, reference should be made to the appended claims to assess the true spirit and scope of the invention, in which exclusive rights are claimed.

What is claimed is:

1. A negative-acting photoimageable composition, comprising:
   A) a film-forming binder polymer having sufficient acid functionality to render said photoimageable composition developable in alkaline aqueous solution, said binder polymer A) comprising a polymer with a multi-modal molecular weight distribution;
   B) a photopolymerizable monomer crosslinkable with said binder polymer (A); and,
   C) a photoinitiator.

2. The composition of claim 1, wherein said binder polymer A) is prepared by:
   i) continuously varying the initiator-to-monomer ratio and monomer mixture acid number during a significant portion of the polymerization reaction; or,
   ii) sequentially varying the initiator-to-monomer ratio and monomer mixture acid number between two levels during a significant portion of the polymerization reaction.

3. The composition of claim 2, wherein:
   said initiator-to-monomer ratio and monomer mixture acid number are varied in an effective amount to produce higher molecular weight and higher acid number polymer components early in the polymerization reaction followed by the production of lower molecular weight and lower acid number polymer components.

4. The composition of claim 3, wherein:
   said higher molecular weight and higher acid number polymer components have a weight average molecular weight (Mw) of between about 70,000 and about 200,000 and an acid number of between about 130 and about 235; and,
   said lower molecular weight and lower acid number polymer components have a weight average molecular weight (Mw) of between about 20,000 and about 70,000 and an acid number of between about 100 and about 130.

5. A dry film photoresist, comprising:
   a polymeric support sheet and a layer of the photoimageable composition of claim 2 thereon.

6. The composition of claim 1, wherein:
   said binder polymer A) has an overall weight average molecular weight (Mw) of between about 20,000 and about 200,000.

7. The composition of claim 1, wherein:
   said binder polymer A) has an overall acid number of between about 100 and about 235.

8. The composition of claim 1, wherein:
   said binder polymer A) comprises an acid-functional acrylic polymer with a multi-modal molecular weight distribution.

9. A dry film photoresist, comprising:
   a polymeric support sheet and a layer of the photoimageable composition of claim 1 thereon.

10. A negative-acting photoimageable composition, comprising:
- A) between about 30 and about 80 wt % based on total weight of A) plus B) plus C) of a binder polymer having sufficient acid functionality to render said photoimageable composition developable in alkaline aqueous solution, said binder polymer A) comprising an acrylic polymer with a multi-modal molecular weight distribution;
- B) between about 19 and about 69 wt % based on total weight of A) plus B) plus C) of an addition-polymerizable, $\alpha,\beta$-ethyleneically unsaturated compound capable of forming an addition polymer with said binder polymer (A) by free-radical initiated chain-propagating addition polymerization; and,
- C) between about 0.05 and about 2 wt % based on total weight of A) plus B) plus C) of a free-radical generating photoinitiator system.

11. The composition of claim 10, wherein said binder polymer A) is prepared by:
- i) continuously varying the initiator-to-monomer ratio and monomer mixture acid number during a significant portion of the polymerization reaction; or,
- ii) sequentially varying the initiator-to-monomer ratio and monomer mixture acid number between two levels during a significant portion of the polymerization reaction.

12. The composition of claim 10, wherein:

said photoinitiator C) comprises 9-phenyl acridine or a homologue thereof.

13. The composition of claim 12, further comprising:
- D) between about 1 and about 8 wt % calculated relative to total weight of A) plus B) plus C) of dibenzoate plasticizer.

14. The composition of claim 13, wherein:

said binder polymer A) has a weight average molecular weight (Mw) of at least about 70,000.

15. The composition of claim 14, wherein:

said binder polymer A) has an acid number of at least about 130 up to about 235.

16. The composition of claim 15, wherein:

said binder polymer A) is derived from methacrylic acid, methyl methacrylate, and n-butyl acrylate monomers.

* * * * *